(12) United States Patent
Taran et al.

(10) Patent No.: US 6,627,823 B1
(45) Date of Patent: Sep. 30, 2003

(54) MULTILAYERED CONNECTION PLATE

(76) Inventors: Alexander Ivanovich Taran, 103575, Zele nograd, korp. 1001, kv8, Moscow (RU); Viktor Konstantinovich Ljubimov, 103482, Zele nograd, korp. 360, kv375, Moscow (RU)

( * ) Notice: Subject to any disclaimer, the term of this patent is extended or adjusted under 35 U.S.C. 154(b) by 0 days.

(21) Appl. No.: 09/830,634

(22) PCT Filed: Mar. 1, 1999

(86) PCT No.: PCT/RU99/00053

§ 371 (c)(1),
(2), (4) Date: Apr. 27, 2001

(87) PCT Pub. No.: WO00/35258

PCT Pub. Date: Jun. 15, 2000

(30) Foreign Application Priority Data

Dec. 8, 1998 (RU) .......................... 98121772

(51) Int. Cl.[7] ........................... H01R 12/04; H05K 1/11
(52) U.S. Cl. ........................................ 174/262; 29/852
(58) Field of Search ................................ 174/262–266; 29/852; 361/792, 795

(56) References Cited

U.S. PATENT DOCUMENTS

| | | | | |
|---|---|---|---|---|
| 5,340,947 A | * | 8/1994 | Credle et al. | 174/262 |
| 5,355,283 A | * | 10/1994 | Marrs et al. | 361/760 |
| 5,621,193 A | * | 4/1997 | Isaak | 174/262 |
| 5,956,843 A | * | 9/1999 | Mizumoto et al. | 29/852 |
| 6,054,761 A | * | 4/2000 | McCormack et al. | 257/698 |
| 6,323,096 B1 | * | 11/2001 | Saia et al. | 438/384 |
| 6,323,439 B1 | * | 11/2001 | Kambe et al. | 174/262 |

FOREIGN PATENT DOCUMENTS

| | | |
|---|---|---|
| RU | 970737 | 4/1981 |
| RU | 1443781 | 3/1987 |

OTHER PUBLICATIONS

"The Pecularities of Assembling the Specialized LSIC on Basic Matrix Chips", Moscow, "Vysshaya Shkola", 1990, pp. 31–34.

* cited by examiner

Primary Examiner—David L Talbott
Assistant Examiner—Jeremy Norris
(74) Attorney, Agent, or Firm—Knobbe, Martens, Olson & Bear LLP

(57) ABSTRACT

A multilayered switching structure is disclosed for the development and the production of an apparatus based on microelectronic components and semiconductor devices. The structure may widely be used in the production of multilayered printed circuit cards and switching structures for monocrystalline modules. The multilayered switching structure includes a plurality of layers of a dielectric material which include electroconductive tracks on their surfaces and which consist of switching layers. This structure also includes contact nodes consisting of metallized contacts which are aligned with each other and which are electrically and mechanically connected together by an electroconductive binding material. The contact nodes are made in the form of splices arranged between the contacts. In a second embodiment, the multilayered switching plate includes electroconductive tracks provided on both sides of each switching layer and are connected together within the limits of each layer by metallized junction openings.

7 Claims, 3 Drawing Sheets

MULTILAYERED CONNECTION PLATE

FIELD OF THE INVENTION

The invention relates to the development and production of an equipment based on microelectronics components and semiconductor devices, and may be widely used in the production of multilayered connection plates. The invention is directed on reducing the labor input and cost of producing the multilayered plates while increasing the conductor spreading density and reducing the number of connection layers. An application of the present invention in producing the connection printed circuit cards for mass electronic equipment with high specific characteristics in the form of multichip modules (MCM) is particularly promising.

BACKGROUND OF THE INVENTION

A multilayered plate based on alumina ceramics is known, the plate comprising alternating ceramic layers on which surfaces are formed conductors by applying and burning the conductive paste. The conductors of adjacent layers are coupled each other by means of holes in ceramic layers filled with a conductive paste which forms, after heat treating, contact nodes for connecting the conductors placed on the surfaces of adjacent layers according to a specific connection scheme (SU 1443781 A, Int. Cl. H 05 K 3/46, 1987).

Advantages of the ceramic multilayered plates are the group character and producing adaptability of processes for forming the contact nodes and assembling the layers into a single multilayered plate.

Nevertheless, the multilayered ceramic plates have great weight and substantial thickness with the contact spreading density and the number of connection layers which do not meet the requirements placed to the modern electronic equipment based on components with great number of leads spaced with a fine pitch. Moreover, due to substantial technological differences in linear sizes of mounting elements on the plate surface, in a high-temperature treating of ceramics (ceramics caking conditions are hardly controllable) great problems occur with aligning contact pads on the plate and precision leads of housing components, which impedes an automation of component mounting on the plate surface, and finally, leads to rising a cost of the equipment based on ceramic plates. Even greater difficulties occur while performing the mounting of housingless IC chips with great number of leading contacts. Thus, the ceramic multilayered plates are generally used in a special equipment with high requirements on a resistance to environment factors.

A multilayered connection plate on polyimide base comprising layers of polymide film having conductive paths placed on both surfaces of every layer is also known. In order to couple conductors, a metallized through holes 0.1 mm in diameter are formed with every layer. For connecting the layers electrically and mechanically into a multilayered printed circuit plate with the single conductor spreading topology are used specifically formed metallized through holes about 1.5 mm in diameter arranged in the form of matrix with a regular pitch common for all layers which form, after aligning, the matrix of channels piercing the multilayered plate throughout. The conductors and metallized holes are formed by methods of lithography and spraying the metallization with a subsequent galvanic build-up to a required thickness and tinning those places in which should be soldered joints. Assembling the layers into a multilayered structure is performed by soldering the joints between the metallized through holes with the methods of vacuum soldering (Panov E. N. The peculiarities of assembling the specialized LSIC on basic matrix chips. Moscow: "Vysshaya Shkola", 1990. Pp. 31–34).

Soldered joints between the through holes are contact nodes serving for electrical interfacing the conductive structures of all layers into a single connection scheme of the multilayered connection plate.

A utilization of the polyimide as an insulating material having unique electrophysical parameters provides high technological and operating features to polyimide multilayered connection plates.

However, the presence of the matrix of metallized through channels piercing the multilayered plate throughout presents difficulties in spreading the connections, which leads to an increase of the number of layers, to a degradation of the plate testability and reducing of plate reliability, as well as to an increase of the polyimide expenditure and complication of the plate producing technology. As a whole, all of this increases the cost and makes impossible to utilize such plates in mass production manufacturing.

A multilayered printed circuit plate with a high density connection is known, comprising pairs of connection layers produced by means of technological substrate and separated with electrical insulating adhesion gaskets to stick the connection layers together. The conductors of adjacent connection layers are interconnected electrically by contact nodes made in the form of metallized through hole (SU 970737 A, Int. Cl. H 05 K 3/46, 1981).

The multilayered plates made according to that invention, while solving the problem of increasing the contact spreading density at the cost of excluding through channels piercing the whole multilayered plate throughout, could not, however, comprise more than 4 metallized connection layers, which is a significant limitation for their usage in the modern equipment (in comparison, the multilayered polyimide plate could comprise up to 30 metallization layers).

The closest technical solution to the present invention by the technical essence and achieved result is a multilayered connection plate based on polyimide, comprising dielectric layers having conductive paths formed on their surfaces, and forming connection layers of the multilayered plate, and also contact nodes made in the form of soldered joints of aligned metallized holes in the connection layers, the nodes performing an inter-layer connection of conductive paths placed both on adjacent and remote connection layers (Panov E. N. The peculiarities of assembling the specialized LSIC on basic matrix chips. Moscow: "Vysshaya Shkola", 1990. Pp. 16–34).

The main disadvantages of this technical solution are:
  a great expenditure of useful connection space due to the matrix of metallized through channels in the multilayered plate, the channels being formed by soldered metallized holes of the connection layers, which decreases substantially the specific of the interconnection spreading density and leads to an increase of the number of connection layers, and hence, to an increase in the labor input and cost, as well as to a decrease of the reliability of the whole plate due to an increase of the number of soldered joints;
  a presence of the insulating gaskets between the connection layers with two-side metallization, comprising the metallized holes in the places where the through channels pierce the multilayered plate, which leads to a factual doubling of the number of layers in the plate and doubling of the number of soldered joints, i.e., to a significant complication of the plate, and hence, to a rise of its cost and decrease of its reliability.

SUMMARY OF THE INVENTION

The problem to be solved by the present invention consists in creating a multilayered connection structure comprising contact nodes of an original design, which usage allows to significantly increase the specific contact spreading density while decreasing substantially a design complexity, labor input and cost of production of the connection layers and multilayered connection structure as a whole.

Moreover, a utilization of the proposed contact node allows to enhance the controllability, reproducibility and reliability of connections in the multilayered connection plate.

The indicated technical result is achieved at the cost of utilizing the original contact nodes in the design of the proposed multilayered connection structure, providing the electrical and mechanical connection between layers.

The set problem is solved with achieving the mentioned result by that in the multilayered connection plate comprising layers of a dielectric material having conductive paths on their surfaces, the layers being connection layers, and contact nodes in the form of metallized contacts mutually aligned and interconnected electrically and mechanically by a conductive binding material, the contact nodes are made in the form of joints between the contacts, some of which contacts are contact pads coupled with conductive paths of the underlying connection layer, and other contacts aligned with said pads are made in the form of metallized holes formed as truncated cones in the upper-lying connection layer, the lesser bases of the truncated cones being faced to the contact pads of the underlying connection layer, and the greater bases of the truncated cones being coupled with the conductive paths on the upper side of the upper-lying connection layer;

and also by that the metallized contact pads are made flat;

and also by that the upper bases of the truncated cones coupled with the conductive paths are made with metallized rims placed on the upper side of the connection layer;

and also by that the diameter D of the greater base of the truncated cone, the width h of the metallized rim, the diameter d of the lesser base of the truncated cone, the thickness t of the dielectric material of the connection layer and the minimal width L of a respective contact pad on the underlying connection layer are coupled with the following relationship:

$$L \geq D+2h=d+2t+2h.$$

In the this embodiment of the multilayered connection structure, the connection layers have only one-side metallization, which excludes the necessity in insulating gaskets.

The second embodiment of the multilayered connection plate is characterized by that the connection layers comprise the conductive paths on both surfaces interconnected with metallized through holes, an insulating layers with metallized through holes are placed between the connection layers, and the contact nodes additionally comprise an intermediate contacts in the form of aforementioned through holes.

The set problem is also solved by that in the multilayered connection plate the conductive paths are placed on both sides of every connection layer and interconnected with metallized through holes within every layer, insulating layers with metallized through holes are placed between the connection layers, and the contact nodes consist of metallized holes in the form of truncated cones made in the upper-lying connection layer, metallized through holes in the insulating layer, and contact pads coupled by conductive binding material on the underlying connection layer, the lesser bases of the truncated cones being jointed with the upper bases of metallized through holes of the insulating layer, and the lower bases of the through holes are jointed with the contact pads of the underlying connection layer, coupled with the conductive paths on the upper side of the underlying connection layer, the upper bases of the truncated cones being coupled with the conductive paths placed on the upper side of the upper-lying connection layer;

and also by that the contact pads are made flat;

and also by that the greater and lesser bases of the truncated cones coupled with the conductive paths on the surfaces of each connection layer are made with metallized rims around the periphery of the bases;

and also by that the metallized through holes of insulating layers are made in the form of cylinders with metallized rims around the periphery of upper and lower bases.

BRIEF DESCRIPTION OF THE DRAWINGS

Embodiment 1 (FIG. 1) has a one-side metallization on every connection layer. FIG. 1a depicts the main parameters of the contact node.

Embodiment 2 (FIG. 2) has a two-side metallization on every connection layer.

THE PREFERRED EMBODIMENT OF THE INVENTION

Figure 1:
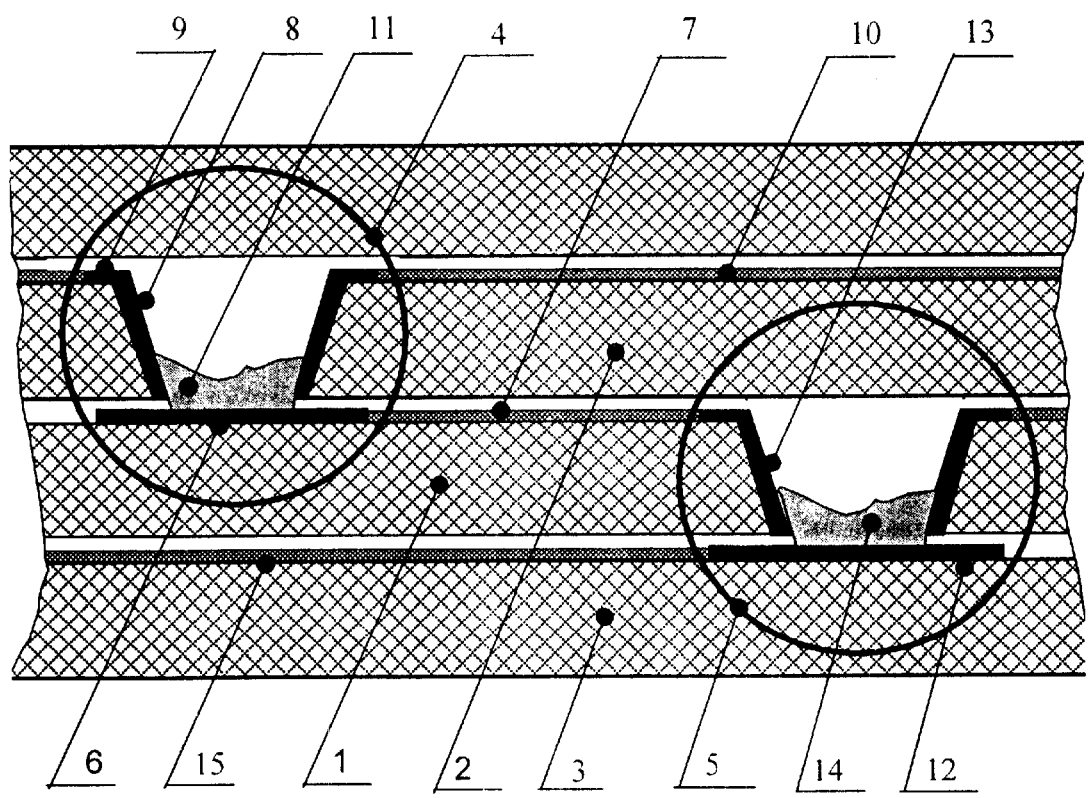
FIG. 1, FIG. 1a and FIG. 2 depicts schematically the fragments of the proposed multilayered connection plate.
Figure 1A:
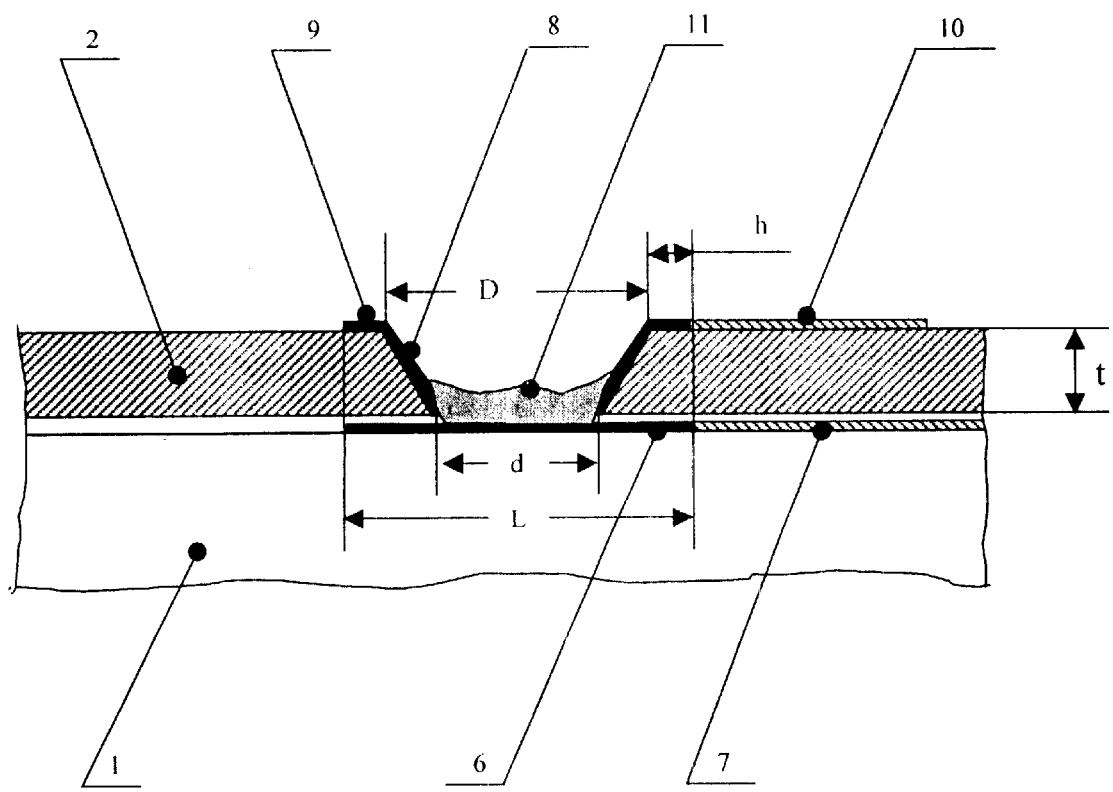

A multilayered connection plate consists of several connection layers. FIG. 1 represents in details three adjacent connection layers 1, 2, 3 and two contact nodes 4, 5.

The contact node 4 (enclosed in an oval) includes a contact pad 6 connected with a conductive path 7 on the upper side of the underlying connection layer 1, and a metallized hole 8 in the form of the truncated cone which greater base faces the upper side of the upper-lying connection layer 2 in the form of a metallized rim 9 coupled with the conductive path 10 on the upper side of the upper-lying connection layer 2. The joint between the contact pad 6 and the metallized hole 8, filled with a conductive binding material 11, forms the contact node 4 proper coupling the conductive paths 7 and 10.

Similarly, the joint between the contact pad 12 of the connection layer 3 and the metallized hole 13 in the connection layer 2 filled with a conductive binding material 14 forms the contact node 5 (enclosed in an oval) connecting the conductive paths 7 and 15 of the connection layers 2 and 3.

In the case of assembling the contact nodes by spraying the binding material, each subsequent connection layer is aligned with the previous one by bench marks, a protective mask is superimposed, aligned and fixed, after which an assembled technological stack is placed into the spraying plant, where a successive layer-by-layer spraying of the conductive materials forming a conductive binding structure with necessary features is performed. In such a way a group assembling of the contact nodes coupling the conductive paths in two adjacent connection layers could be performed.

After connecting the layers in the spraying plant, a visual and electrical control of the formed contact nodes is performed, if necessary, after which the process is repeated for the next connection layer etc. until the assembling of whole connection plate is finished.

When assembling the contact nodes by soldering, all connection layers are aligned in a necessary sequence, after which the stack is placed into the vacuum soldering plant. In conditions of a partial vacuum and common heating up to the temperature of solder melting a joint soldering in every contact node is occurred simultaneously in all layers of the multilayered connection plate under effect of capillary forces.

An interaction of the elements of the multilayered connection plate during its functioning occurs as follows (by the example of FIG. 1 fragment).

A signal from the conductive paths 10 of the connection layer 2 passes through the metallized hole 8 in the connection layer 2, conductive binding material 11 and contact pad 6 on the upper side of the connection layer 1, forming the contact node 4, into the conductive path 7 of the connection layer 1, and then, through the metallized hole 13 in the connection layer 1, conductive binding material 14 and contact pad 12 on the upper side of the connection layer 3, forming the contact node 5, into the conductive path 15 of the connection layer 3.

Figure 2:
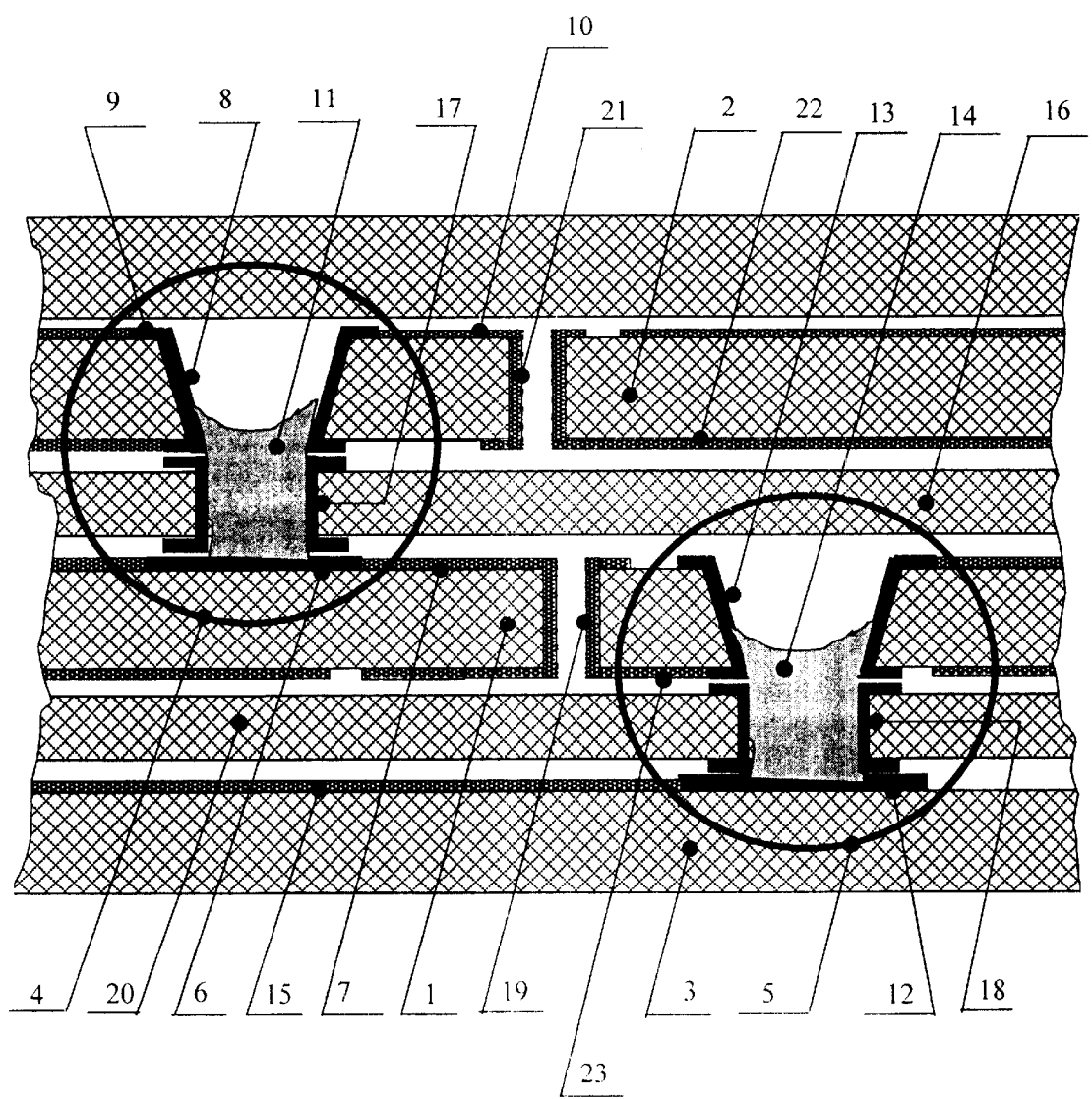

A fragment of the second embodiment of the multilayered connection plate, on the base of connection layers with two-side metallization, is depicted in FIG. 2, where three adjacent connection layer 1, 2, 3 separated by insulating layers 16 and 20, and also two contact nodes 4, 5 are represented.

The contact node 4 (enclosed in an oval) includes a contact pad 6 coupled with a conductive path 23 on the lower side of the underlying connection layer 1 through the conductive path 7 on the upper side of the underlying connection layer 1 and a metallized through hole 19, a metallized through hole 16 in the insulating layer 16 and a metallized hole 8 in the form of the truncated cone, which greater base faces the upper side of the upper-lying connection layer 2 in the form of a metallized rim 9 coupled with the conductive path 22 on the lower side of the upper-lying connection layer 2 through the metallized through hole 21 and the conductive hole 10. The joint between the contact pad 6, metallized through hole 17, and the metallized hole 8, filled with the conductive binding material 11, forms the contact node 4 proper coupling the conductive paths 22 and 23 of the connection layers 1 and 2.

Similarly, the joint between the contact pad 12 of the underlying connection layer 3, metallized through hole 18 in the insulating layer 20 and a metallized hole 13 in the upper laying connection layer 1, filled with the conductive binding material 14, form the contact node 5 (enclosed in an oval) coupling the conductive paths 7 and 15 of the connection layers 1 and 3.

The operating of the second embodiment of the multilayered connection plate is fully similar to the above described operating of the first embodiment of the plate.

In forming the holes in the form of the truncated cone in the dielectric material of the connection layer during the process of fluid etching through the protective mask, as a result of the side etching effect, the following relationship between the main parameters of the contact nodes elements takes place:

$$L \geq D+2h=d+2t+2h, \text{ where:}$$

D is a diameter of the greater base of the truncated cone;

h is a width of the metallized rim, by means of which the metallized hole is coupled with the conductive paths on the surface of the connection layer;

d is a diameter of the lesser base of the truncated cone;

t is a thickness of the dielectric material of the connection layer;

L is a minimal width of a respective contact pad on the underlying connection layer.

INDUSTRIAL APPLICABILITY

A manufacturing of the multilayered connection plates with contact nodes of the proposed design allows to provide:

a high reproducibility and reliability of a great number of contact nodes coupling the connection layers in the multilayered connection plate;

a high contact spreading density with the optimal number of the layers (from the viewpoint of the manufacture adaptability and cost of the producing the multilayered plates);

a high precision of the multilayered connection structures and mounting elements on their surfaces, sufficient to manufacture the multichip modules;

a simplicity of the design, defining a high adaptability to manufacture and low cost of the producing the multi-layered connection plates.

What is claimed is:

1. A multilayered connection plate, comprising:

a plurality of layers of a dielectric material with conductive paths on their surfaces, the layers being connection layers; and a plurality of contact nodes in the form of metallized contacts mutually aligned and interconnected electrically and mechanically by conductive binding material, wherein the conductive paths are placed on both sides of every connection layer and interconnected with metallized through holes within every layer, insulating layers with metallized through holes are placed between the connection layers, and the contact nodes comprise metallized holes in the form of truncated cones made in the upper-lying connection layer, metallized through holes in the insulating layer, and contact pads coupled by conductive binding material on the underlying connection layer, the lower bases of the truncated cones being joined with the upper bases of metallized through holes of the insulating layer, and the lower bases of the through holes are joined with the contact pads of the underlying connection layer, coupled with the conductive paths on the upper sides of the underlying connection layer, the upper bases of the truncated cones being coupled with the conductive paths placed on the upper side of the upper-lying connection layer.

2. The multilayered connection plate according to claim 1, wherein the contact pads are flat.

3. The multilayered connection plate according to claim 1, wherein the upper and lower bases of the truncated cones coupled with the conductive paths on the surfaces of every connection layer are made with metallized rims around the periphery of the bases.

4. The multilayered connection plate according to claim 1, wherein the metallized through holes of the insulating layers are made in the form of cylinders with metallized rims being formed around the periphery of the upper and lower bases.

5. A multilayered connection plate, comprising:
- a first connection layer having a conductive path on a surface thereof;
- a second connection layer deposited adjacent to the first connection layer having a conductive path on a surface thereof;
- a first node provided through the first connection layer and having a metallized hole, an inner surface of which is connected to the conductive path of the first connection layer, and a contact pad connected with the conductive path of the second connection layer, wherein a conductive binding material is deposited in the metallized hole to be in contact with the inner surface of the metallized hole and the center pad so as to form a connection between the first and second connection layers;
- a third connection layer deposited adjacent to the second connection layer having a conductive path on a surface thereof; and
- a second node provided through the second connection layer having a metallized hole, an inner surface of which is connected to the conductive path of the second connection layer, and a contact pad connected with the conductive path of the third connection layer, wherein a conductive binding material is deposited in the metallized hole to be in contact with the inner surface of the metallized hole and the contact pad so as to form connection between the second and third connection layers.

6. A multilayered connection plate, comprising:
- a first connection layer having a conductive path on a surface thereof;
- an insulating layer deposited adjacent to the first connection layer
- a second connection layer deposited adjacent to the insulating layer and opposite to the first connection layer and having a conductive path on a surface thereof; and
- a node provided through the first connection layer and the first insulating layer and having a metallized hole provided through the first connection layer, an inner surface of which is connected to the conductive path of the first connection layer, a metallized through hole provided through the first insulating layer, and a contact pad connected with the conductive path of the second connection layer, wherein a conductive binding material is deposited in the metallized hole and the metallized through hole to be in contact with each inner surface of the metallized hole and the metallized through hole and the contact pad so as to form connection between the first and second connection layers.

7. The multilayered connection plate according to claim 6, further comprising:
- a second insulating layer deposited adjacent to the second connection layer and opposite to the first insulating layer;
- a third connection layer deposited adjacent to the second insulating layer and opposite to the second connection layer; and
- another node provided through the second connection layer and the second insulating layer and having a metallized hole provided through the second connection layer, an inner surface of which is connected to the conductive path of the second connection layer, a metallized through hole provided through the second insulating layer, and a contact pad connected with the conductive path of the third connection layer, wherein a conductive binding material is deposited in the metallized hole and the metallized through hole to be in contact with each inner surface of the metallized hole and the metallized through hole and the contact pad so as to form connection between the second and third connection layers.

* * * * *

UNITED STATES PATENT AND TRADEMARK OFFICE
CERTIFICATE OF CORRECTION

PATENT NO.        : 6,627,823 B1                                                  Page 1 of 1
APPLICATION NO.   : 09/830634
DATED             : September 30, 2003
INVENTOR(S)       : Alexander Ivanovich Taran and Viktor Konstantinovich Ljubimov It is certified that error appears in the above-identified patent and that said Letters Patent is hereby corrected as shown below:

Column. 7, line 14 which reads "center" should be --contact--.

Signed and Sealed this

Twenty-second Day of January, 2008

JON W. DUDAS
*Director of the United States Patent and Trademark Office*